United States Patent [19]

Kley

[11] Patent Number: 5,239,297

[45] Date of Patent: Aug. 24, 1993

[54] POSITION-ENCODED SCREW AND METHOD AND SYSTEM FOR CALIBRATING A POSITION-ENCODED SCREW

[76] Inventor: Victor B. Kley, 1119 Park Hill Rd., Berkeley, Calif. 94708

[21] Appl. No.: 569,860

[22] Filed: Aug. 20, 1990

[51] Int. Cl.$^5$ .................................................. H03M 1/30
[52] U.S. Cl. ................................. 341/13; 341/6; 341/11
[58] Field of Search .............. 341/13, 15, 11, 1, 106, 341/6, 111–116; 250/206.1, 206.2, 231.13, 231.14, 231.18, 237 R, 237 G; 411/14; 33/706–708, 819, 820; 116/282, 112, 208, DIG. 21, 200

[56] References Cited

U.S. PATENT DOCUMENTS

| | | | |
|---|---|---|---|
| 1,167,644 | 1/1916 | Jacques, Sr. | 33/819 |
| 2,613,445 | 10/1952 | Zuckerman | 33/818 |
| 3,028,589 | 4/1962 | Broadwell . | |
| 3,293,759 | 12/1966 | Moe et al. | 33/708 |
| 3,465,269 | 9/1969 | Hendershot | 200/38 E |
| 3,705,400 | 12/1972 | Cordes, Jr. | 341/1 X |
| 3,742,488 | 6/1973 | Von Voros | 341/13 |
| 3,768,094 | 10/1973 | Henrich | 341/15 |
| 3,794,814 | 2/1974 | Lay et al. | 341/6 |
| 4,103,427 | 8/1978 | Ledley, III | 33/819 |
| 4,218,823 | 8/1980 | Matsumoto et al. | 33/820 X |
| 4,488,051 | 12/1984 | Brown et al. | 250/231.13 X |
| 5,012,239 | 4/1991 | Griebeler . | |

Primary Examiner—Sharon D. Logan
Attorney, Agent, or Firm—Limbach & Limbach

[57] ABSTRACT

A position-encoded screw, and a method and system for calibrating a position-encoded screw. In one embodiment, the screw includes a threaded portion and a set of position-encoding marks arranged along a spiral path around the threaded screw portion. To calibrate the screw, a set of sensors detects each mark as the screw is incrementally advanced past the sensors, and the absolute position of the screw is independently measured using an auxiliary device such as a precision electro-optic scale. The output of the sensor set is processed to generate encoded position signals representing encoded displacements of the screw relative to a known position. A set of the independently generated absolute position signals, one corresponding to each encoded position signal, is stored in the form of a look-up table, so that each absolute position signal may be read from the table in response to a corresponding encoded position address signal. The look-up table may be used with the screw by advancing the screw relative to a nut which includes a set of position sensors until the screw reaches a fixed position. Screw position signals generated by the sensors are processed to generate an encoded position signal corresponding to the fixed position. An accurate position of the screw is determined by reading an absolute position signal from the table which corresponds to the encoded position signal.

30 Claims, 2 Drawing Sheets

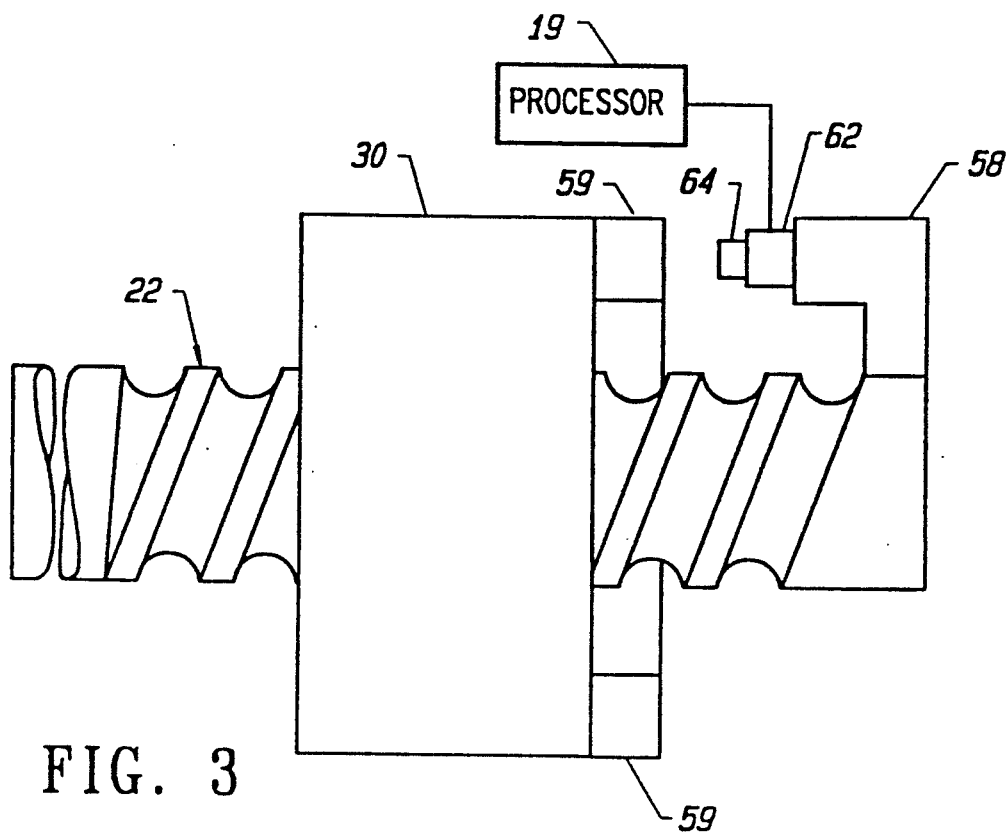
FIG. 3
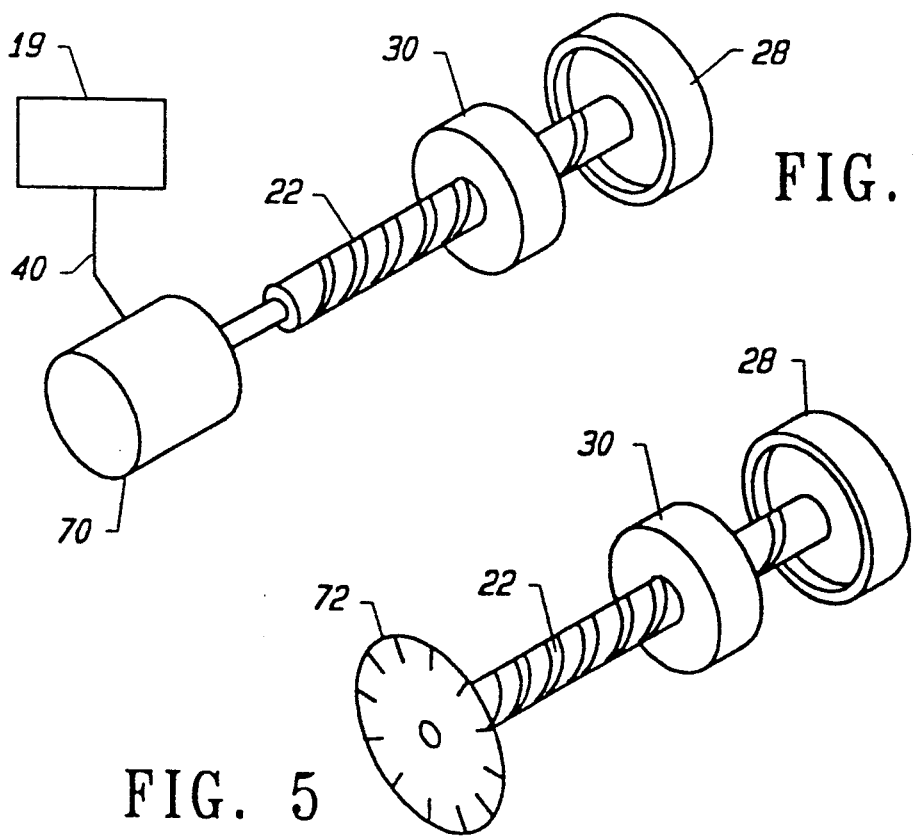
FIG. 4
FIG. 5

POSITION-ENCODED SCREW AND METHOD AND SYSTEM FOR CALIBRATING A POSITION-ENCODED SCREW

FIELD OF THE INVENTION

The invention is a position-encoded screw, and a method and system for calibrating a position-encoded screw.

BACKGROUND OF THE INVENTION

In conventional machine tools requiring a high degree of precision, it is conventional to employ precision ground lead screw assemblies. Such a lead screw assembly typically includes a lead screw into which a recessed, spiral-shaped race has been ground, and a set of ball bearings positioned in the race. Using such an assembly, the machine tool operator may control the position of the lead screw to within less than $10^{-3}$ inch. However, conventional precision-ground lead screw assemblies are very expensive, and typically cost on the order of $1000 per assembly.

Less expensive lead screw assemblies (which typically cost less than one-tenth the price of a conventional precision-ground lead screw assembly) include machine-rolled lead screws. Because the pitch of the thread (or ball bearing race) of a machine-rolled screw is subject to relatively large manufacturing tolerances, it has not been possible for a machine tool operator to control the position of a machine-rolled lead screw sufficiently accurately for purposes of high-precision machining. Until the present invention, it had not been known how to position inexpensive screws (manufactured with a wide range of size and shape tolerances) with extreme precision.

SUMMARY OF THE INVENTION

The invention is a position-encoded screw, and a method and system for calibrating a position-encoded screw. In a preferred embodiment, the invention includes a screw having a threaded portion and a set of position-encoding marks arranged along a spiral path around the threaded screw portion, a nut which mates with the threaded screw portion, and a measurement means for measuring the position of the screw relative to the nut. The measurement means includes a sensor set attached to the nut.

In one embodiment, the marks include a set of incremental ("relative") displacement marks, and a set of absolute position marks. One or more sensors are attached to the nut for sensing the relative displacement marks, and one or more absolute position sensors are attached to the nut for sensing the absolute position marks.

To calibrate the screw, a set of sensors (which may be optical sensors, magnetic sensors, or other sensors) detects each mark as the screw is incrementally advanced past the sensors, and the absolute position of the screw is independently measured using an auxiliary device such as a precision electro-optic scale. The output of the sensor set is processed to generate encoded position signals representing encoded displacements (or offsets) of the screw relative to a known position (i.e., the position of an absolute position sensor). A set of the independently generated absolute position signals (one corresponding to each encoded position signal) is stored in the form of a look-up table, in a manner so that each absolute position signal may be read from the table in response to a corresponding encoded position address signal.

After the screw has been calibrated ("accurized") by generating the look-up table, the look-up table and screw are used to accurately determine the position of the screw relative to a nut which includes a set of position sensors. The screw is advanced relative to the nut until the screw reaches a fixed position. Position signals generated by the sensors while the screw advances are processed to generate an encoded position signal corresponding to the fixed position. The encoded position signal may be the number of position marks counted while the screw advanced. An accurate position of the screw is determined by reading an absolute position signal from the table which corresponds to the encoded position signal. In this embodiment, there is no requirement that an absolute reference signal be measured to generate the encoded position signal.

Preferably, the size (number of memory cells) of the look-up table is reduced by storing only offset information therein, with the offset information representing differences between the various actual screw positions and the reference position.

In another embodiment, in which the screw need not have position marks, the screw has an end position sensor mounted at a first end in a position so that the nut may be advanced along the screw into contact with the end position sensor. In a variation on this embodiment, the end position sensor is mounted on the nut, and an actuator plate is mounted at a first screw end. In either end position sensor embodiment, at an "end" reference position in which the screw has been advanced relative to the nut until the end position sensor contacts the actuator plate or the nut, an end position signal is generated in response to pressure exerted thereon by the actuator plate or nut. The displacement of the screw relative to the end reference position is then measured by counting the number of steps through which the screw is displaced using a stepper motor, or by monitoring the screw position using a rotary encoder affixed to the screw, and again a displacement from the reference position is stored for each resolved position.

BRIEF DESCRIPTION OF THE DRAWINGS

FIG. 3 is a side elevational view of a second screw and nut assembly which embodies the invention.

FIG. 4 is a simplified perspective view of a portion of the FIG. 2 assembly, with a stepper motor attached to it.

FIG. 5 is a simplified perspective view of a portion of the FIG. 2 assembly, with a rotary encoder attached to it.

DETAILED DESCRIPTION OF THE PREFERRED EMBODIMENTS

Throughout the specification, including in the claims, the term "set" denotes a collection of one or more elements. For example, the phrase "sensor set" denotes both a single sensor and two or more sensors. Also throughout the specification including in the claims, the term "displacement" denotes either linear or angular displacement, and the term "advance" is used in a broad sense to denote either an advance or a retraction.

Figure 1:
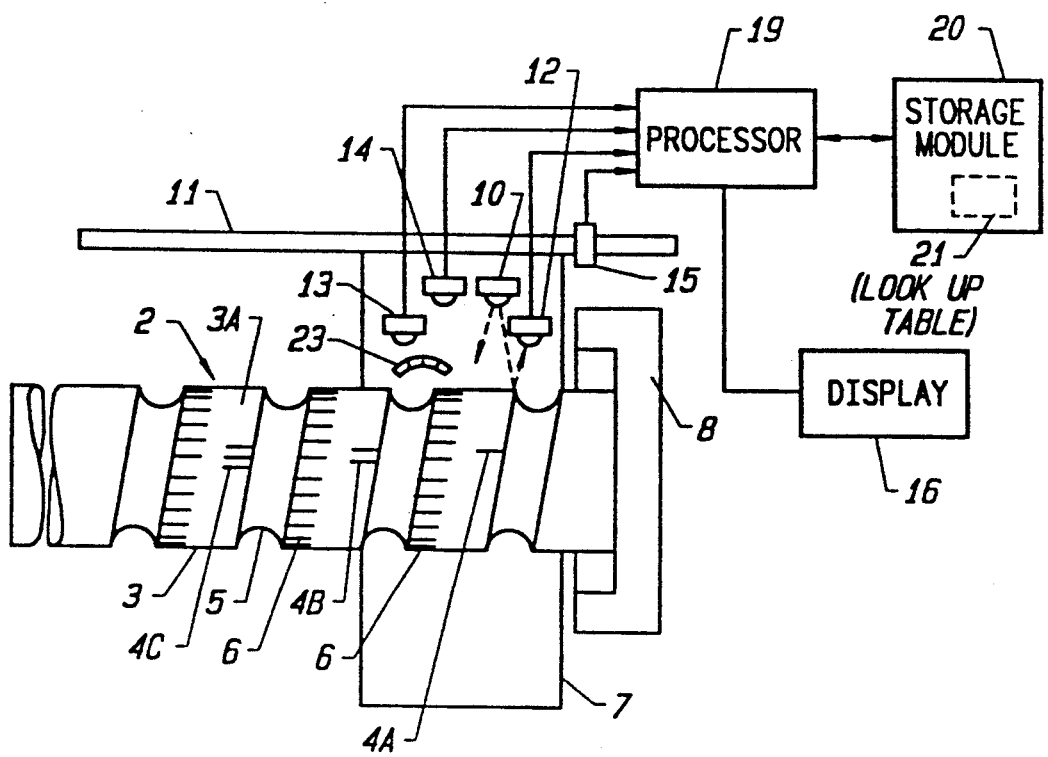
FIG. 1 is a cross-sectional side view of a preferred embodiment of the inventive screw, with means for calibrating the screw.

With reference to FIG. 1, screw 2 includes a central threaded portion. The threaded portion includes a land portion 3 which defines a generally cylindrical surface, and a recessed, helical race 5 around land portion 3. A set of incremental (or "relative") displacement marks 6, and a set of absolute position marks 4a, 4b, and 4c (collectively referred to as marks 4), are arranged in a spiral pattern around land portion 5. Screw 2 may optionally also include an actuator plate 8 at one end, as shown.

Marks 4 and 6 may be machine-ground or laser scribed into land portion 3. Alternatively, land portion 3 may covered by a coating 3a, and marks 4 and 6 may be defined by etching or otherwise stripping away regions of the coating 3a.

The absolute position of the screw may be determined by detecting marks 4 using a suitably positioned sensor 12. Marks 4 may conveniently be grouped into subsets (i.e., subset 4a, subset 4b, and subset 4c), so that when a first subset is aligned at a first position relative to a nut, after the screw is rotated by 360 degrees with respect to the nut the next subset will be occupy that first position in relation to the nut. Sensor 12 distinguishes between the subsets to determine the screw's absolute position. Thus, sensor 12 may generate an output comprising a single "spike" when subset 4a (comprising a single mark) is aligned therewith, and a double "spike" when subset 4b (comprising a double mark) is aligned therewith. Alternatively, marks 4 may be encoded using a conventional encoding scheme (such as Grey code) which is interpreted using appropriate sensors.

Because the invention employs a special technique (to be described below) to calibrate screw 2, neither screw 2, nor marks 4 and 6, need be manufactured with precise dimensions and spacing. For example, screw 2 may be an inexpensive machine-rolled lead screw.

Nut 7 mates with screw 2, so that the screw will advance with respect to nut 7 (toward the left or right in FIG. 1) as it rotates with respect to the nut. In one preferred embodiment, a large number of ball bearings (not shown) are packed within nut 7, so that the bearings ride along race 5 as screw 2 advances relative to nut 7.

Radiation source 10, and sensors 12, 13, and 14, are fixedly mounted within nut 7. Sensor 12 is positioned to detect the presence of absolute position marks 4 by sensing radiation from source 10 that has reflected from screw 2. Quadrature plate 23 is positioned under sensors 13 and 14. Plate 23 preferably includes two groups of slits, one of which has inter-slit spacing which matches the spacing of marks 6. Sensors 13 and 14 detect radiation from source 10 that has passed through the slits. Preferably, one group of slits (i.e., the group under sensor 13) has an inter-slit spacing one fourth that of the other group (the group under sensor 14), so that the two groups provide signals, 90 degrees out of phase with respect to each other, to sensors 13 and 14 respectively. This quadrature relationship allows the system's electronic resolution to be four times the resolution of marks 6, and permits determination of the direction of rotation of screw 2.

In variations on the FIG. 1 embodiment, sensor 14 may be omitted, and a suitable single sensor 13 employed to detect the presence of each mark 6. In other variations on the FIG. 1 embodiment, sensors 12–14 may be magnetic sensors (or other sensors) and radiation source 10 either omitted or replaced by a source suitable for use with the sensors employed.

To calibrate (or "accurize") screw 2, the output signals generated in sensor set 12, and sensor set 13–14 (as screw 2 is incrementally advanced past the sensor sets) are supplied to processor 19 for processing. In processor 19 (which may be a digital computer), the sensor output signals are processed to generate encoded position signals representing encoded displacements (or offsets) of screw 2 relative to a known position (i.e., a reference position along absolute position scale 11). For example, processor 19 may count the number of marks 6 that pass by sensors 13–14 after mark 4 passes by sensor 12.

The absolute position of screw 2 is independently measured using an absolute position measuring unit which comprises position scale 11 (fixedly mounted in relation to sensors 12–14, or in relation to screw 2 itself), and measurement head 15 for reading scale 11. Scale 11, which may be a precision electro-optic scale attached to nut 7, is free to slide in relation to head 15. Processor 19 correlates each absolute position signal generated by head 15 with one of the encoded position signals, and stores the absolute position signals (each corresponding to one of the encoded position signals) in the form of a look-up table 21 within storage module 20. Processor 19 may access table 21 to read out an absolute position signal from table 21 (for example, for display on display unit 16) by supplying an encoded position address signal (which corresponds to the absolute position signal) to storage module 20.

Preferably, the size of table 21 (i.e., the number of memory cells of module 20 occupied by table 21) is reduced by storing only offset (or "compressed") information in table 21. Such offset information may represent differences between the various absolute screw positions measured using scale 11 and head 15, a single reference position measured using scale 11 and head 15.

After the screw has been calibrated ("accurized") by generating look-up table 21, the look-up table may be used to determine very precisely the position of the screw relative to a nut. Scale 11 may be disconnected from nut 7 after the screw has been accurized (prior to the operation of determining the screw position using the look-up table), as the scale is not needed to precisely determine the position of the screw relative to the nut. For example, with reference to FIG. 1 (without scale 11), screw 2 may be advanced relative to nut 7 from a first known position (for example the position in which mark 4 is adjacent to and detected by sensor 12) until the screw reaches a second position (i.e., the position shown in FIG. 1). Position signals generated by sensors 12–14 while the screw advances into the second position are processed by processor 19 to generate an encoded position signal corresponding to the second position Such encoded position signal may indicate the number of marks 6 that passed by sensors 13–14 as the screw advanced from the first to the second position. An accurate position of the screw is then determined by reading the prestored absolute position signal from table 21 which corresponds to the encoded position signal.

Figure 2:
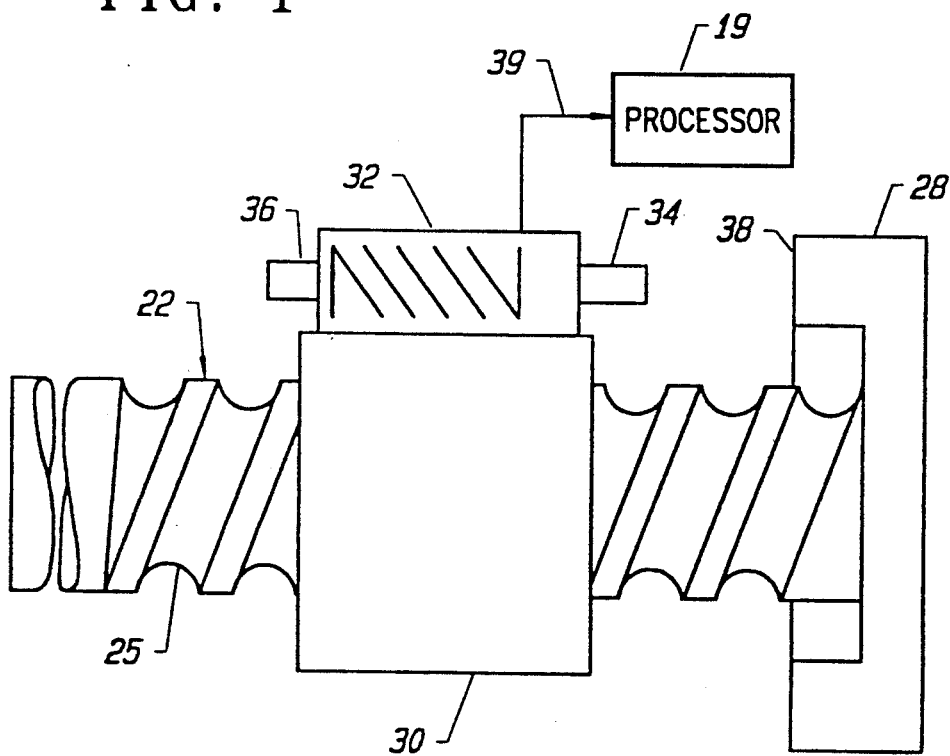
FIG. 2 is a side elevational view of a first screw and nut assembly which embodies the invention.

A variation on the FIG. 1 screw assembly will next be described with reference to FIG. 2. In FIG. 2, screw 22 need not be marked with absolute or relative position marks. Screw 22 mates with nut 30, so that screw 22 will advance relative to the nut as it is rotated with respect to the nut.

End position sensor unit 32 fixedly mounted on nut 30 includes right end sensor 34 (and optionally also left end sensor 36). When surface 38 of actuator plate 28 is translated relative to nut 30 into contact with sensor 34, unit 32 generates an end signal which is supplied to processor 19 on line 39. In other words, sensor 34 generates a logical 1 or 0 depending on whether plate 28 is engaged with sensor 34.

A second actuator plate identical to plate 28 may also be attached to the left end of screw 22 (not shown in FIG. 2). When such second actuator plate is translated relative to nut 30 into contact with sensor 36, unit 32 also generates an end signal, which is also supplied to processor 19 on line 39.

With reference to FIG. 4, a stepper motor 70 may be connected to screw 22 for rotating screw 22 in discrete increments (or "steps") relative to nut 30. A signal from motor 70, indicative of the number of steps through which motor 70 has rotated screw 22 following generation of each end signal, is supplied on line 40 to processor 19. Processor 19 processes the sensor signal it receives on line 39 (shown in FIG. 2) and the signal it receives on line 40 (shown in FIG. 4) to generate an encoded position signal of the same type described above with reference to FIG. 1. Such encoded signal may be employed to access an absolute position signal from a look-up table of the type described with reference to FIG. 1.

In an alternative embodiment to be described next with reference to FIG. 5, a rotary encoder 72 is fixedly attached to screw 22. In the FIG. 5 embodiment, rotary position signals measured in a conventional manner using encoder 72 are supplied to processor 19, instead of the signal on line 40 described above with reference to FIG. 4. Processor 19 processes such rotary position signals, with the sensor signal received on line 39 (shown in FIG. 2), to generate an encoded position signal of the type described above with reference to FIG. 1. For example, the encoded position signal may simply be a count of the number of rotary position signals (which may be pulses or steps) received after generation of an end signal. The encoded signal may be employed to access an absolute position signal from a look-up table of the type described with reference to FIG. 1.

FIG. 3 is a variation on the FIG. 2 embodiment. In the FIG. 3 assembly, end position sensor unit 62 (including end sensor 64) is mounted on member 58 attached at an end of screw 22. No end position sensor unit is mounted on nut 30, but preferably, an annular actuator member 59 is affixed to nut 30. Sensor 64 may be a pressure transducer, and unit 62 may include means for generating an end position signal in response to pressure exerted on sensor 64 by actuator member 59.

Similarly, in the FIG. 2 embodiment, sensor 34 may be a pressure transducer and unit 32 may include means for generating an end position signal in response to pressure exerted on sensor 34 by surface 38 of plate 28.

Various modifications and alterations in the structure and method of operation of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A screw device, including:
    a screw having a threaded screw portion including a land portion and a helical race, wherein the race is recessed within the land portion; and
    a set of position-encoding marks arranged along a spiral path around the land portion.
2. The device of claim 1, also including:
    a nut which mates with the threaded screw portion; and
    measurement means for measuring an encoded displacement of the screw relative to the nut, wherein the measurement means includes a sensor set attached to the nut.
3. The device of claim 1, wherein the screw is a rolled lead screw.
4. The device of claim 1, wherein the land portion defines a generally cylindrical surface.
5. The device of claim 4, wherein the marks are machine-ground into the land portion.
6. The device of claim 4, wherein the marks are laser scribed into the land portion.
7. The device of claim 4, wherein the land portion is covered by a coating, and the marks are defined by stripping away regions of the coating.
8. The device of claim 1, wherein the set of position-encoding marks includes a set of incremental displacement marks, and a set of absolute position marks.
9. The device of claim 8, also including:
    absolute position sensor means positioned adjacent the screw, for sensing the absolute position marks;
    relative position sensor means positioned adjacent the screw, for sensing the incremental displacement marks;
    a processor for generating a encoded position signal representing an encoded displacement of the screw, by processing outputs of the relative position sensor means and the absolute position means.
10. The device of claim 9, wherein the processor also includes:
    means for accessing a look-up table to generate a position signal which corresponds to the encoded position signal, and which represents a position of the screw relative to a nut.
11. A screw device, including:
    a screw having a threaded screw portion and a first end;
    a nut dimensioned to mate with the threaded screw portion; and
    an end position measurement means for generating an end signal when the screw occupies an end position with respect to the nut, wherein the end position measurement means includes an end position sensor mounted at the first end of the screw.
12. A screw device, including:
    a screw having a threaded screw portion and a first end;
    a nut dimensioned to mate with the threaded screw portion; and
    an end position measurement means for generating an end signal when the screw occupies an end position with respect to the nut, wherein the end position measurement means includes an end position sensor mounted on the nut.
13. The device of claim 12, also including:
    an actuator plate mounted at the first end of the screw.
14. The device of claim 13, wherein the end position sensor includes:

a means for generating an end position signal in response to pressure exerted thereon by the actuator plate when the end position sensor contacts the actuator plate.

15. The device of claim 12, wherein the screw is a rolled lead screw.

16. A method for calibrating a screw having a threaded portion, including the steps of:
   (a) marking a set of position-encoding marks in a spiral pattern around the threaded portion;
   (b) advancing the screw past a sensor set;
   (c) generating sensor signals, each indicative of the proximity of one of the marks to a sensor in the sensor set;
   (d) processing the sensor signals to generate an encoded position signal for each of the marks; and
   (e) storing absolute position signals, each corresponding to a different one of the encoded position signals, in look-up table form.

17. The method of claim 16, wherein the position-encoding marks include a set of absolute position marks, and a set of relative position marks, and wherein each of the absolute position signals is indicative of a displacement of the screw relative to a reference position.

18. The method of claim 17, wherein each of the encoded position signals is indicative of a displacement of the screw relative to a reference position.

19. The method of claim 16, wherein each sensor in the sensor set is an optical sensor.

20. The method of claim 16, also including the steps of:
   advancing the screw relative to a nut, wherein a position sensor means is mounted in the nut;
   generating a first encoded position signal by processing outputs of the position sensor means; and
   identifying a first one of the stored absolute position signals which corresponds to the first encoded position signal.

21. A method for determining the position of a screw, wherein the screw has a threaded portion, including the steps of:
   (a) advancing the screw relative to a nut while monitoring an end position sensor;
   (b) generating an end signal at the end position sensor when the screw occupies an end position relative to the nut;
   (c) after step (b), advancing the screw while generating position signals indicative of incremental displacements of the screw from the end position; and
   (d) processing the position signals, and the end signal, to generate a first encoded position signal.

22. The method of claim 21, also including the steps of:
   advancing the screw past a sensor set while generating sensor signals indicative of the position of the screw;
   processing the sensor signals to generate encoded position signals;
   generating absolute position signals, each corresponding to a different one of the encoded position signals, and storing the absolute position signals in look-up table form; and
   identifying a first one of the stored absolute position signals which corresponds to the first encoded position signal.

23. The method of claim 21, wherein the end position sensor is a pressure sensor.

24. The method of claim 21, wherein the screw has a first end and the end position sensor is mounted to the first end, and also including the steps of:
   monitoring the end position sensor to generate an end signal when the nut meets the first end of the screw; and
   processing the end signal and the outputs of the sensor means to generate the first encoded position signal.

25. The method of claim 21, wherein the screw has a first end, wherein an actuator plate is attached to the first end of the screw, and wherein the end position sensor generates the end signal in response to pressure exerted thereon by the actuator plate when the end position sensor contacts the actuator plate.

26. A system for calibrating a screw having a threaded portion, including:
   means for marking the threaded portion with a set of position-encoding marks in a spiral pattern around the threaded portion;
   means for advancing the screw past a sensor set;
   means for generating sensor signals indicative of the proximity of each of the marks to a sensor in the sensor set; and
   a processor including means for processing the sensor signals to generate an encoded position signal for each of the marks, and means for storing absolute position signals, each corresponding to a different one of the encoded position signals, in look-up table form.

27. The system of claim 26, wherein the position-encoding marks include an absolute position mark, and a set of relative position marks, and wherein each said encoded position signal is indicative of a displacement of the screw relative to a reference position.

28. The system of claim 27, wherein each of the absolute position signals is indicative of a displacement of the screw relative to a reference position.

29. The system of claim 26, wherein each sensor in the sensor set is an optical sensor.

30. The system of claim 26, also including:
   a nut;
   a position sensor means mounted to the nut;
   means for generating a first encoded position signal by processing outputs of the position sensor means; and
   a processor for generating a signal representing a first one of the stored absolute position signals which corresponds to the first encoded position signal.

* * * * *